(12) United States Patent
Chiu et al.

(10) Patent No.: US 6,954,383 B2
(45) Date of Patent: Oct. 11, 2005

(54) ON-SYSTEM PROGRAMMABLE AND OFF-SYSTEM PROGRAMMABLE CHIP

(75) Inventors: Yen-Chang Chiu, Taipei (TW); Chun-An Tang, Baoshan Township, Hsinchu County (TW); Kuang-Yeu Lin, Jungli (TW); Cheng-Hao Tang, Tucheng (TW)

(73) Assignee: Elan Microelectronics Corporation, Hsin-Chu (TW)

( * ) Notice: Subject to any disclaimer, the term of this patent is extended or adjusted under 35 U.S.C. 154(b) by 0 days.

(21) Appl. No.: 11/000,956

(22) Filed: Dec. 2, 2004

(65) Prior Publication Data

US 2005/0094469 A1 May 5, 2005

Related U.S. Application Data

(62) Division of application No. 10/658,289, filed on Sep. 10, 2003, now Pat. No. 6,882,577.

(30) Foreign Application Priority Data

Sep. 11, 2002 (TW) .......................................... 91120914 A

(51) Int. Cl.⁷ ............................................. G11C 16/04
(52) U.S. Cl. ............................... 365/189.01; 365/185.01
(58) Field of Search ........................ 365/189.01, 185.01, 365/201

(56) References Cited

U.S. PATENT DOCUMENTS 5,412,260 A * 5/1995 Tsui et al. ..................... 326/39
5,825,199 A * 10/1998 Shelton et al. ................ 326/38
2004/0109354 A1 * 6/2004 Wang et al. ............ 365/185.11

* cited by examiner

Primary Examiner—Anh Phung
(74) Attorney, Agent, or Firm—Rosenberg, Klein & Lee

(57) ABSTRACT

An on-system programmable and off-system programmable chip comprises a control circuit connected to an on-system programmable nonvolatile memory and an off-system programmable nonvolatile memory, and a pumping circuit connected to the on-system programmable nonvolatile memory. In a programming mode of the chip, external programming voltages are provided for programming the off-system programmable nonvolatile memory, and in an operation mode of the chip, the pumping circuit produces internal programming voltages for the on-system programmable nonvolatile memory for programming the on-system programmable nonvolatile memory.

8 Claims, 8 Drawing Sheets

US 6,954,383 B2

ON-SYSTEM PROGRAMMABLE AND OFF-SYSTEM PROGRAMMABLE CHIP

This application is a divisional of application Ser. No. 10/658,289 filed on Sep. 10, 2003, now U.S. Pat. No. 6,882,577, issued on Apr. 19, 2005.

FIELD OF THE INVENTION

The present invention relates generally to a programmable chip and, more particularly, to a chip with an on-system programmable nonvolatile memory and an off-system programmable nonvolatile memory, a method for forming the chip and a method for programming the chip.

BACKGROUND OF THE INVENTION

An electrically programmable nonvolatile memory, for example a flash memory or an electrically erasable programmable memory, has to dispose a pumping circuit beside the memory array thereof to provide the high voltages for programming and erasing the memory array. The programming or erasing voltage is several times of that provided by a power supply, and is related to the boosting stage number of the pumping circuit. On the other hand, writing more bits instead of one bit per one time will shorten the programming period and thereby speed up the programming procedure, so that the pumping circuit is also a large current apparatus. Due to the high voltage and large current, the pumping circuit occupies large chip area and needs high cost. However, the pumping circuit is available only for programming and erasing purpose, and as a result, it is not economical to employ a pumping circuit in each chip, especially for those devices with embedded programmable memory. In addition to the pumping circuit, some memory arrays are supplied with auxiliary circuits for programming and erasing procedure, for example the state machine in a flash memory to prevent the flash memory cells from over erasing, and these auxiliary circuits further expend chip area and manufacturing cost.

For a standard memory device, the memory capacity thereof is so huge that the area occupied by the memory array is quite large and thus the ratio of the area occupied by the pumping circuit and state machine is not too high. For other types of devices, nevertheless, such as microcontroller and digital signal processor (DSP), the memory capacity equipped thereof is not very large, and thus the ratio of the area occupied by the pumping circuit and state machine becomes much higher if these circuits are still kept to maintain a high programming efficiency. FIG. 1 is a diagram of a typical microcontroller 10, in which a central processing unit (CPU) 12 is connected to a static random access memory (SRAM) 14, an input/output (I/O) unit 15 and a multi-time programmable (MTP) memory 16. The MTP memory 16 is programmed with the program code for the operation of the CPU 12 and the data code for the apparatus the microcontroller 10 is applied thereto. To program the MTP memory 16, the programming voltages VPP and VNN are produced by the pumping circuit 18 from the supply voltage VDD and ground GND to the MTP memory 16. If the MTP memory 16 is implemented with flash memory cells, a state machine is further included together to prevent the MTP memory 16 from over erasing, and thereby the pumping circuit 18 and state machine 20 occupy large chip area. To reduce the chip area and cost, in U.S. Pat. No. 6,385,073 issued to Yu et al., the pumping circuit and common control circuit are separated from the individual chips and become shared circuits for a plurality of chips connected systematically and the individual chips only sustain the memory array and a reduced control circuit in each one.

Generally, after the microcontroller 10 is manufactured, the program code for the operation of the CPU 12 is programmed in the MTP memory 16 and will not altered unless the program code for the operation of the CPU 12 is updated with a new version. In contrast, the data code in the MTP memory 16 is updated depending on specific applications of the microcontroller 10. In other words, there is a need for the content of the MTP memory 16 to be conveniently updated in part. However, either a complete memory 22 embedded in the chip 10 or removal of the pumping circuit 18 and state machine 20 to reduce the chip area and cost, the chip 10 still cannot be on-system programmed by users themselves, since the program code for the operation of the CPU 12 is programmed in the MTP memory 16 and thereby the microcontroller 10 cannot program itself by directly programming the MTP memory 16.

For simplicity, the programmable nonvolatile memory hereinafter will refer to a complete memory except for the pumping circuit and state machine, or the memory array and its essential control circuit such as the decoder and sense amplifier. For the present invention not be indistinct, some details not concerned will be omitted in the description of various embodiments, without influencing illustrating and understanding the principle of the present invention. To distinguish the programmable nonvolatile memory referred in the present invention from conventional programmable nonvolatile memories, a dotted block 22 is additionally introduced in FIG. 1 to refer to a conventional programmable nonvolatile memory, such that readers can easily understand the embodiment designed in accordance with the principle and scope of the present invention.

SUMMARY OF THE INVENTION

An object of the present invention is to disclose a chip with an on-system programmable nonvolatile memory and an off-system programmable nonvolatile memory, a method for forming the chip and a method for programming the chip.

In a chip, according to the present invention, a control circuit is connected to an on-system programmable nonvolatile memory and an off-system programmable nonvolatile memory, a pumping circuit is connected to the on-system programmable nonvolatile memory, and a nonvolatile memory is connected to the control circuit. The off-system programmable nonvolatile memory is programmed with the program code for the operation of the control circuit, and the on-system programmable nonvolatile memory can be on-system programmed repeatedly by the control circuit. The chip comprises a programming mode and an operation mode. In the programming mode, the off-system programmable nonvolatile memory can be programmed, and the programming voltages are provided from external of the chip. In the operation mode, the on-system programmable nonvolatile memory can be directly programmed by the control circuit, and the programming voltages are provided by the pumping circuit in the chip.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
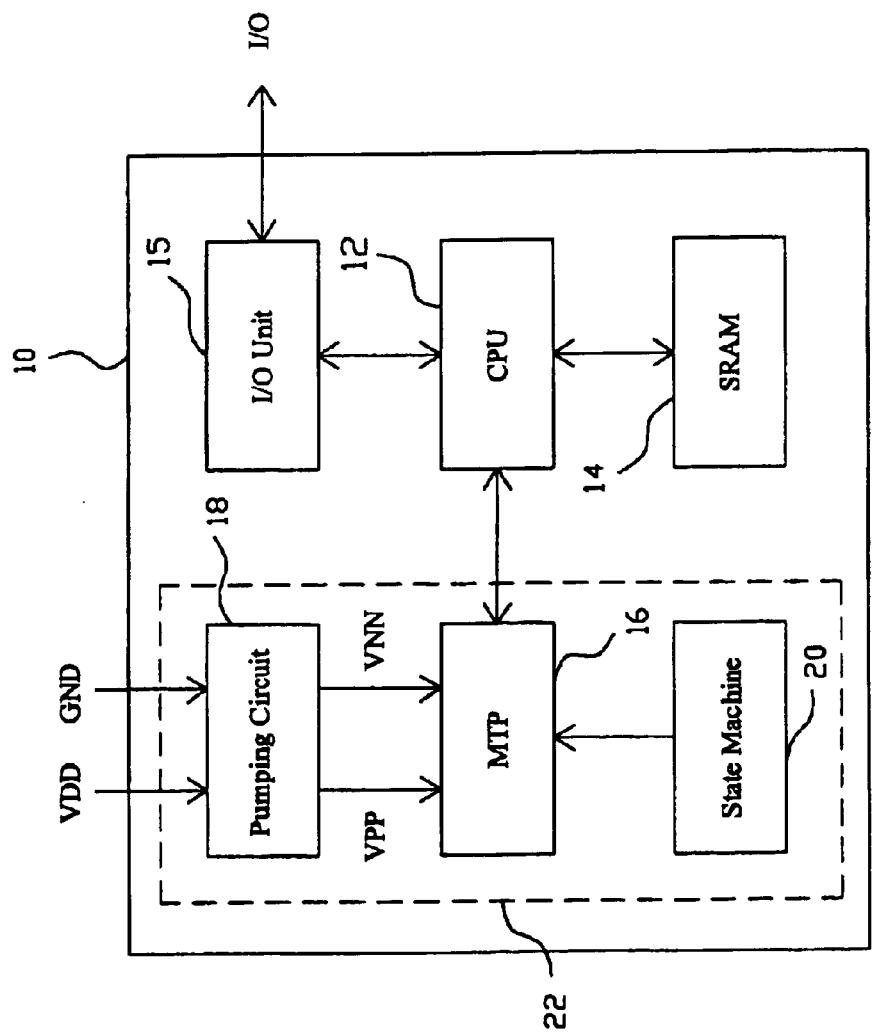
FIG. 1 is a diagram to show a conventional microcontroller.
Figure 2:
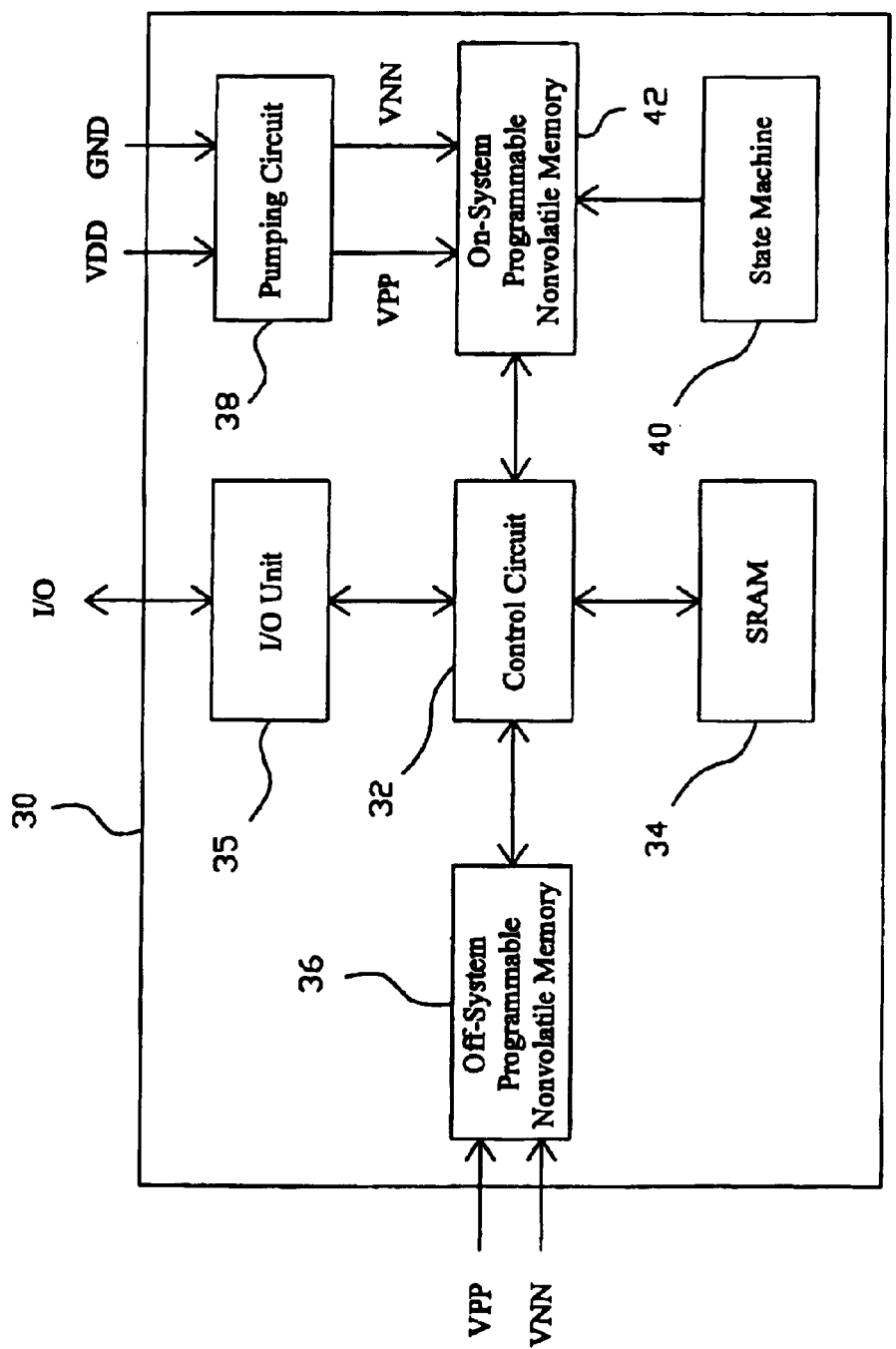
FIG. 2 is a diagram of the first embodiment according to the present invention.

FIG. 2 is a diagram of the first embodiment according to the present invention. In chip 30, a control circuit 32 is connected to an off-system programmable nonvolatile memory 36 and an on-system programmable nonvolatile memory 42, an SRAM 34 and an I/O unit 35 are connected to the control circuit 32, a pumping circuit 38 and a state machine 40 are connected to the on-system programmable nonvolatile memory 42 that includes a flash memory array. The chip 30 comprises a programming mode and operation mode. In the programming mode, the off-system programmable nonvolatile memory 36 can be programmed, and in the operation mode, the on-system programmable nonvolatile memory 42 can be programmed. When programming the off-system programmable nonvolatile memory 36, the programming voltages VPP and VNN are provided from external of the chip 30 to the off-system programmable nonvolatile memory 36, and when programming the on-system programmable nonvolatile memory 42, the pumping circuit 38 produces the programming voltages VPP and VNN from the supplied voltage VDD and ground GND of the chip 30 to the on-system programmable nonvolatile memory 42, and the state machine 40 prevents the on-system programmable nonvolatile memory 42 from over erasing. Typically, the capacity of the off-system programmable nonvolatile memory 36 is larger than that of the on-system programmable nonvolatile memory 42, and the program code for the operation of the control circuit 32 is programmed in the off-system programmable nonvolatile memory 36 before the chip 30 leaves the factory. On the other hand, the on-system programmable nonvolatile memory 42 is planned to be programmed with data code, such as the password, identification (ID) code and RF channel number and so on for applications of the chip 30. Furthermore, users can update or amend the content in the on-system programmable nonvolatile memory 42 by an on-system programming method after the chip 30 leaves the factory. Different from the SRAM 34 be a volatile memory, the off-system programmable nonvolatile memory 36 and on-system programmable nonvolatile memory 42 can store and retain the content programmed thereof after power off. The off-system programmable nonvolatile memory 36 may be a one-time programmable (OTP) memory or an MTP memory, and may include an electrically erasable programmable memory array or a flash memory array.

The programming of the on-system programmable nonvolatile memory 42 is controlled and operated by the chip 30 itself. Different from conventional chips programmed in their programming mode by programmer equipments connected to the chips, the programming of the on-system programmable nonvolatile memory 42 is in the operation mode of the chip 30, instead in the programming mode. The control process for the control circuit 32 to program the on-system programmable nonvolatile memory 42 can be programmed in the off-system programmable nonvolatile memory 36 in advance or read from external of the chip 30 through the I/O unit 35 before the programming procedure, and stored in the SRAM 34 for the operations of the chip 30 when programming the on-system programmable nonvolatile memory 42. If necessary, the chip 30 can be provided with other volatile memory in addition to the SRAM 34 to store the programming control process. In an embodiment, a part of the stored content of the on-system programmable nonvolatile memory 42 will be altered, and for which the control circuit 32 reads out the content of the on-system programmable nonvolatile memory 42 and stores it to the SRAM 34, and then amends the part to be updated and programs the amended part into the on-system programmable nonvolatile memory 42.

Figure 3:
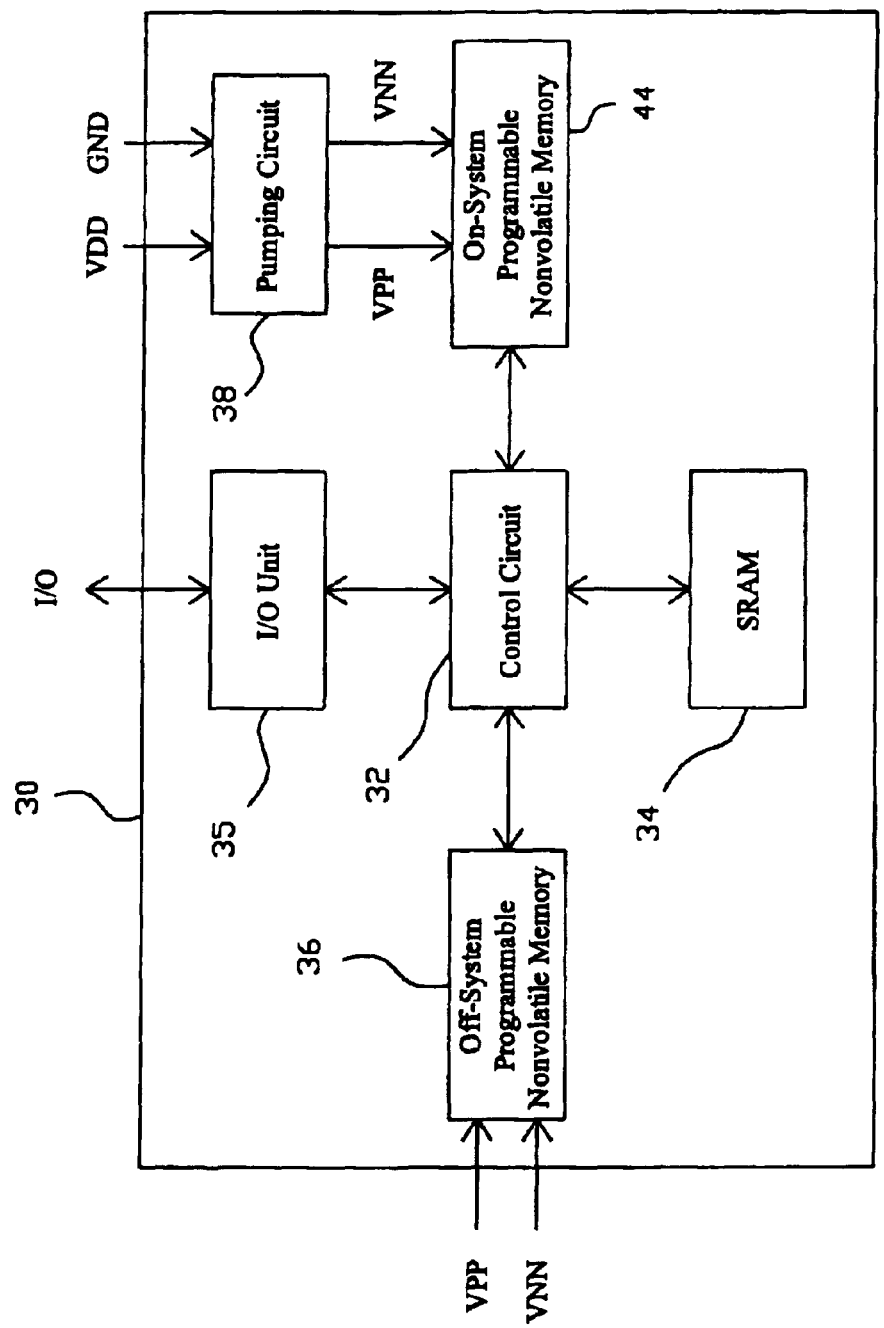
FIG. 3 is a diagram of the second embodiment according to the present invention.
Figure 4:
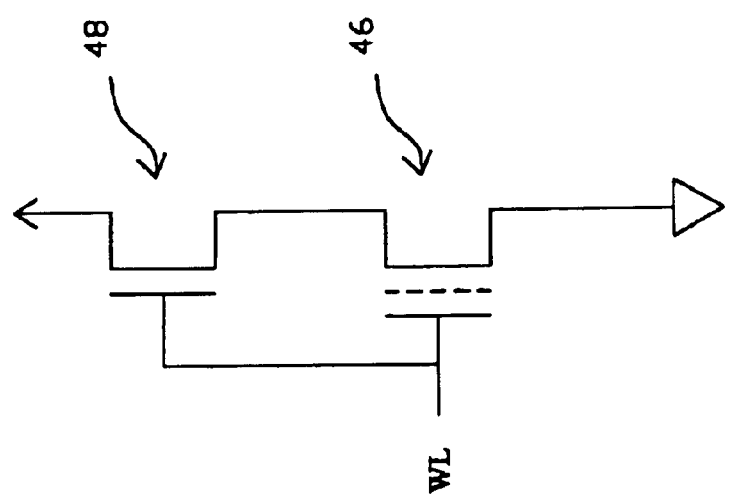
FIG. 4 shows a memory cell for the on-system programmable nonvolatile memory in FIG. 3.

FIG. 3 is a diagram of the second embodiment according to the present invention. Similar to that in FIG. 2 for most functional blocks, this embodiment employs an on-system programmable nonvolatile memory 44 with the function of preventing it from over erasing to replace the on-system programmable nonvolatile memory 42 and state machine 40 in the first embodiment. The on-system programmable nonvolatile memory 44 includes a plurality of memory cells each having the circuit shown in FIG. 4, which comprises a flash memory cell 46 connected in series with a MOS transistor 48 with the gate of the MOS transistor 48 connected to the gate of the flash memory cell 46 and word line WL. In other embodiments, the gate of the MOS transistor 48 can be connected to other control signal than the word line WL.

Figure 5:
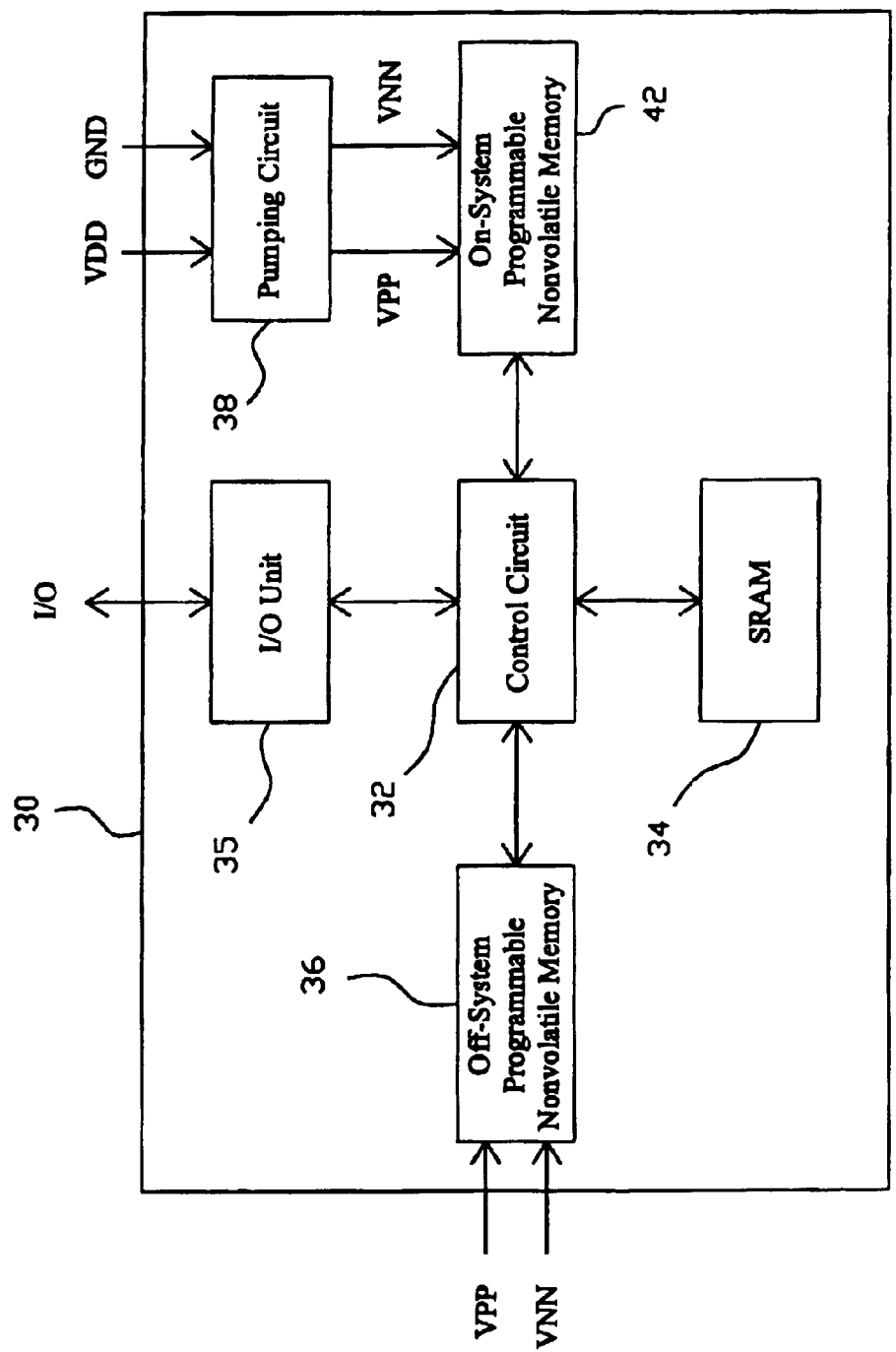
FIG. 5 is a diagram of the third embodiment according to the present invention.

FIG. 5 is a diagram of the third embodiment according to the present invention, which is similar to that in FIG. 2, only the state machine 40 is replaced with a state machine program executed by the control circuit 32 to prevent the on-system programmable nonvolatile memory 42 from over erasing. The program to perform the function of the state machine can be programmed in the off-system programmable nonvolatile memory 36 in advance or read from external of the chip 30 through the I/O unit 35 before the programming procedure, and stored in the SRAM 34 for the operations of the chip 30 when programming the on-system programmable nonvolatile memory 42. If necessary, the chip 30 can be provided with other volatile memory in addition to the SRAM 34 to store the program to perform the function of the state machine.

The on-system programmable nonvolatile memory 42/44 is divided into a plurality of programming units, for example a memory cell, a bit, a byte or a word. In the programming process, the minimum unit to be programmed is the programming unit and is programmed unit by unit into the on-system programmable nonvolatile memory 42/44. The cost of the chip 30 can be lower by using the flash memory process to manufacture the on-system programmable nonvolatile memory 42/44, and users can amend the content of the flash memory by byte, as do to electrically erasable programmable memory. Moreover, the procedure to program the on-system programmable nonvolatile memory 42/44 is performed under the operation mode of the chip 30, and thus it is easy as executing a general application program. To program the off-system programmable nonvolatile memory 36, a programmer is connected to the chip 30, as in a conventional programming procedure, and the programming voltages VPP and VNN are supplied to the off-system programmable nonvolatile memory 36 from external of the chip 30; while user can program the on-system programmable nonvolatile memory 42/44 by themselves, as in the execution of an application program.

Figure 6:
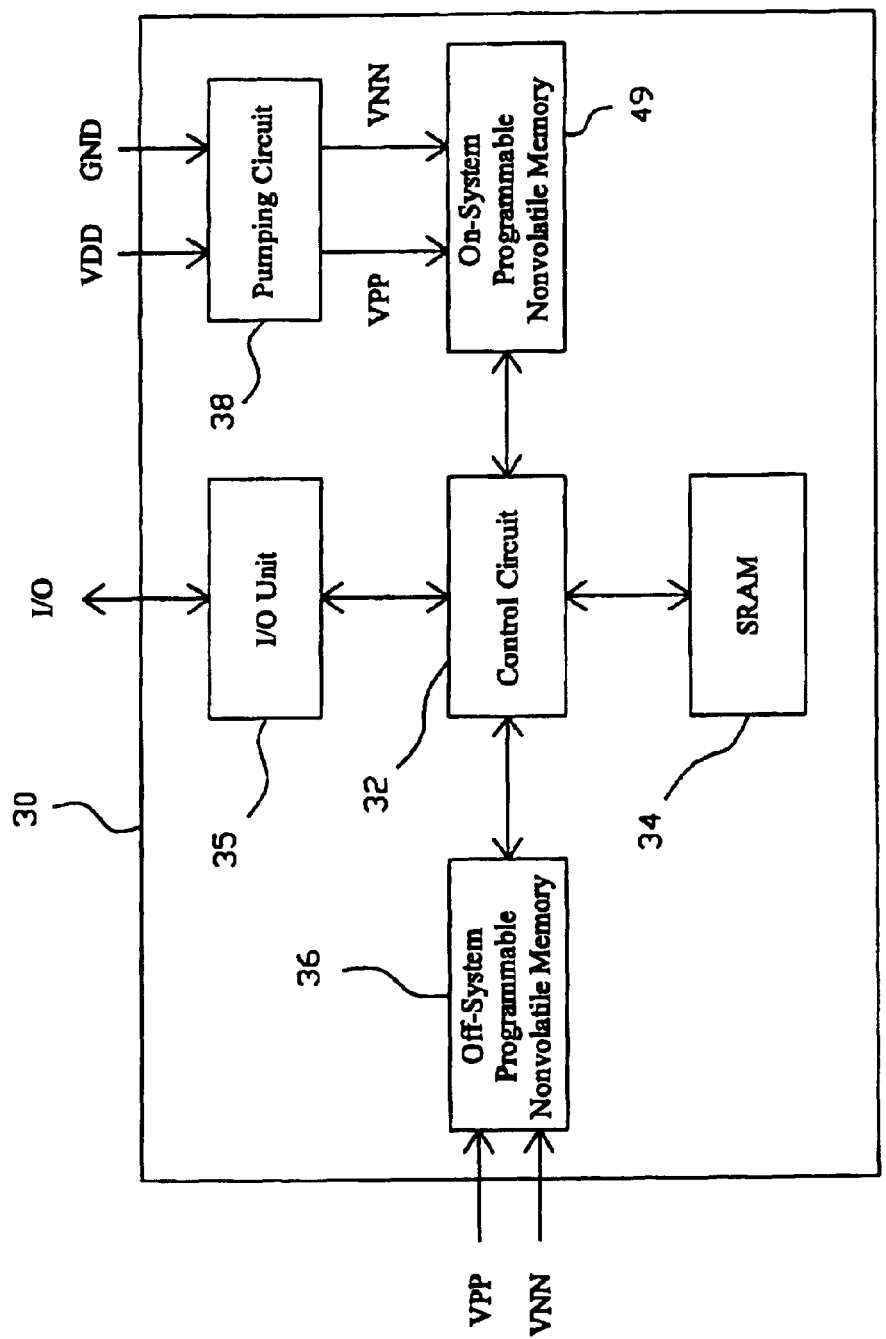
FIG. 6 is a diagram of the fourth embodiment according to the present invention.

The on-system programmable nonvolatile memory can be implemented with electrically erasable programmable memory array, flash memory array or other programmable nonvolatile memory array. In the above embodiments, the on-system programmable nonvolatile memory 42/44 employs a flash memory array. Alternatively, FIG. 6 shows a diagram of the fourth embodiment according to the present invention, in which an on-system programmable nonvolatile memory 49 employs an electrically erasable programmable memory array. An electrically erasable programmable memory can be programmed with the unit of one bit or one byte. There are two ways of programming the programmable nonvolatile memory 49, one is storing the new content in the SRAM 34 in advance, and then reading it out from the SRAM 34 and programming it into the programmable nonvolatile memory 49 during the programming procedure, and another way is, during the programming procedure, reading in the new content from external of the chip 30 through the I/O unit 35 and immediately programming it into the programmable nonvolatile memory 49.

Figure 7:
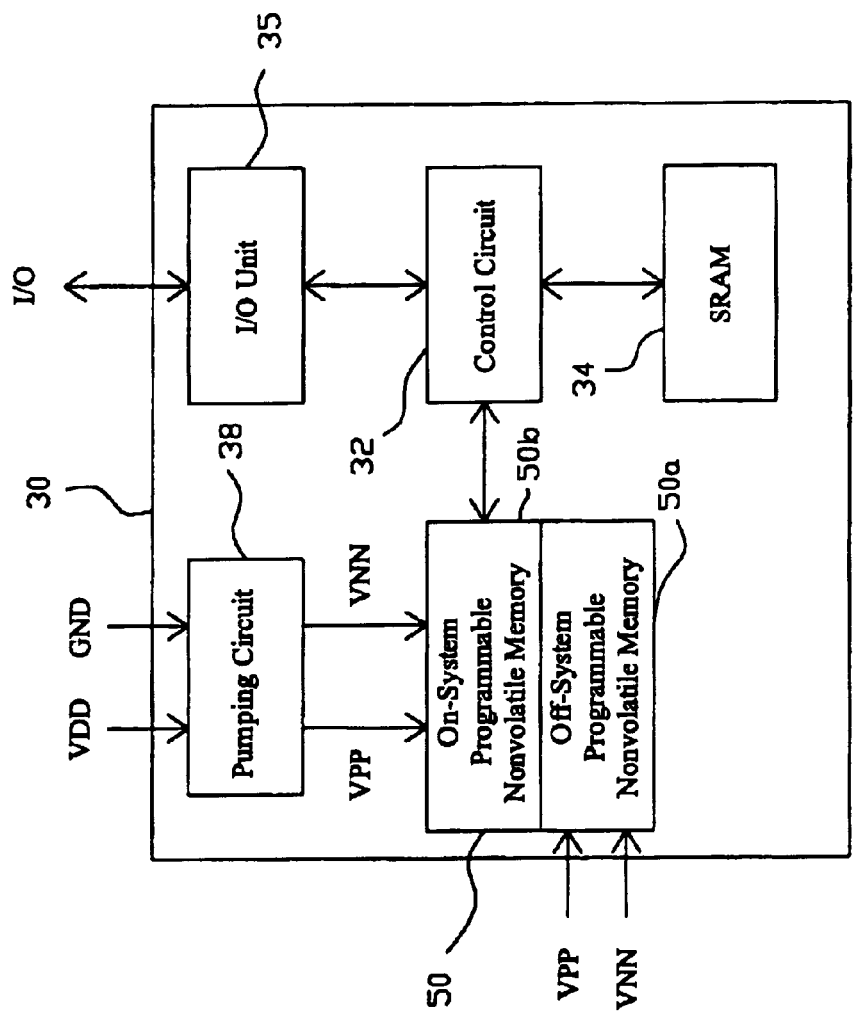
FIG. 7 is a diagram of the fifth embodiment according to the present invention.

Although the off-system programmable nonvolatile memory 36 and on-system programmable nonvolatile memory 42/44/49 are shown with two separated blocks in the above embodiments, they may be manufactured in the same memory block for hardware implementation, and FIG. 7 shows one for such embodiments. In the chip 30, the nonvolatile memory 50 is separated into two blocks for the off-system programmable nonvolatile memory 50a and on-system programmable nonvolatile memory 50b, among which only the on-system programmable nonvolatile memory 50b is connected to the pumping circuit 38. The off-system programmable nonvolatile memory 36 is still connected to external programming voltages VPP and VNN from outside of the chip 30 for programming thereto.

Figure 8:
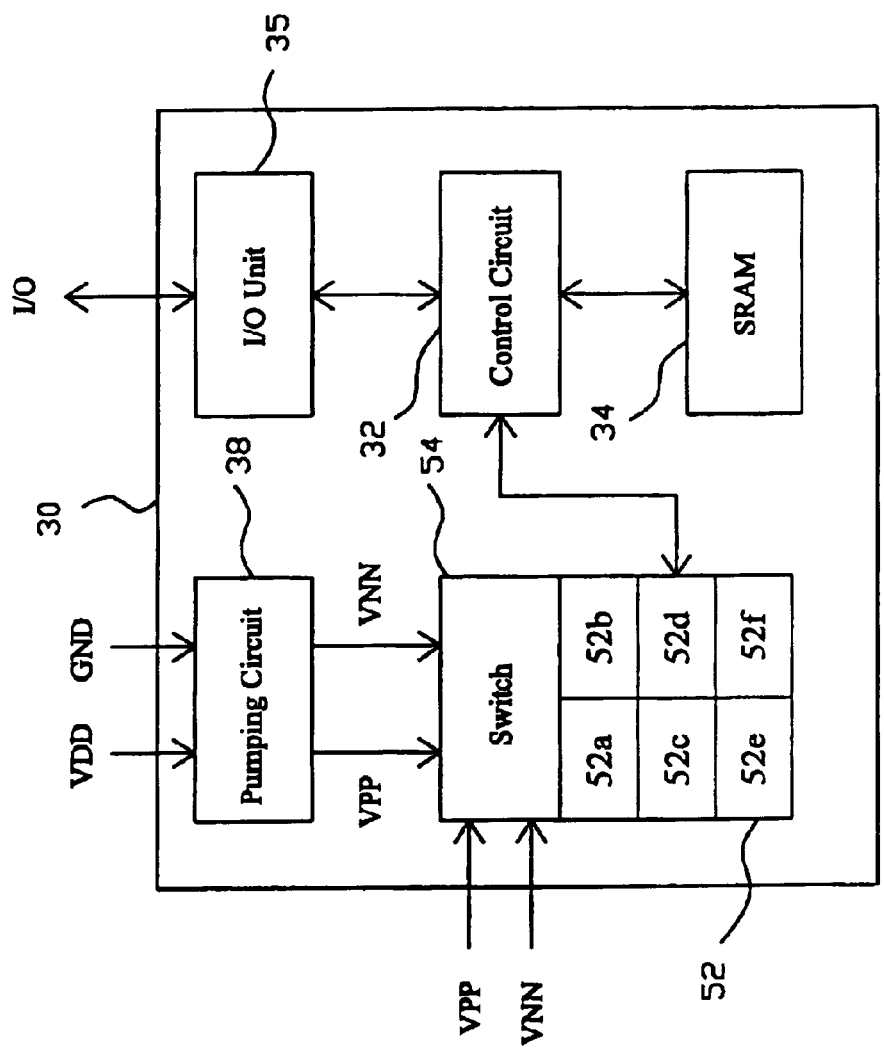
FIG. 8 is a diagram of the sixth embodiment according to the present invention.

FIG. 8 is a diagram of another embodiment with a divided nonvolatile memory block. In chip 30, a nonvolatile memory 52 is divided into six memory blocks 52a–f, among which one is selected for the on-system programmable nonvolatile memory, and the others for the off-system programmable nonvolatile memory. The on-system programmable nonvolatile memory in the nonvolatile memory 52 is connected to the pumping circuit 38 with a switch 54, and the external programming voltages VPP and VNN outside of the chip 30 are bypassed to the off-system programmable nonvolatile memory in the nonvolatile memory 52. The switch 54 may be implemented with fuses or a programmed circuit, and with specific burnt-out configuration of the fuses or connection arrangement of the programmed circuit, the block assignment of the nonvolatile memory 52 to the on-system programmable nonvolatile memory and off-system programmable nonvolatile memory is determined. Alternatively, in other embodiments, the switch 54 may be controlled or operated by the control circuit 32 to determine the on-system programmable nonvolatile memory and off-system programmable nonvolatile memory from the blocks of the nonvolatile memory 52, only connections are existed between the control circuit 32 and switch 54.

When programming the off-system programmable nonvolatile memory, the programming voltages VPP and VNN are provided from external to the chip 30, instead internal of the chip 30. The content desired to be programmed to the off-system programmable nonvolatile memory can be transmitted to the off-system programmable nonvolatile memory from external to the chip 30 directly through the pins VPP and VNN, or reading in from external to the chip 30 through the I/O unit 35. Since the off-system programmable nonvolatile memory is programmed using external programming voltages from outside of the chip 30, high speed programming and erasing can be achieved without bulky circuits for pumping circuit and related control circuit within the chip 30.

For various applications, the off-system programmable nonvolatile memory and on-system programmable nonvolatile memory have different concerns and different point of views, which are listed in Table 1.

TABLE 1

| Application | Off-System Programmable Nonvolatile Memory | On-System Programmable Nonvolatile Memory |
| --- | --- | --- |
| Stored Object | Program Code | Data Code |
| Chip Mode | Programming Mode | Operation Mode |
| Stored Content | Program for Control Circuit | Numeral & Text |
| Purpose of Content | Process Execution | Data Storage |

Distinguishing between the off-system programmable nonvolatile memory and on-system programmable nonvolatile memory by their stored objects, the program or instruction for operation of the control circuit 32 are programmed in the off-system programmable nonvolatile memory, and the on-system programmable nonvolatile memory is to be programmed for data and by which users can update the data directly by the above on-system programming method by themselves. Regarding to the mode the chip 30 to manipulate with, the off-system programmable nonvolatile memory is programmed in the programming mode by programmer equipment, and the on-system programmable nonvolatile memory is programmed in the operation mode by users as for the normal operation. For the stored content, the program code for the control circuit 32 to perform control process including the programming process is programmed in the off-system programmable nonvolatile memory, and the others not for functioning the control circuit 32 itself such as numeral, text and applications for other devices or apparatus is programmed in the on-system programmable nonvolatile memory. By identifying the purpose of the stored content, the off-system programmable nonvolatile memory is to be programmed for the control circuit 32 to perform or execute its functions and other procedures or processes including that for programming the on-system programmable nonvolatile memory, and the on-system programmable nonvolatile memory is for data storage and for data capable of updating by users. Those embodiments are designed for illustration of the principle of the present invention and all descriptions for them are not limitations to the present invention. In other applications, the off-system programmable nonvolatile memory can be also programmed with data, and the on-system programmable nonvolatile memory can be also programmed with any program except for the operation of the control circuit 32 itself.

From the aforementioned description of the embodiments, one skilled in the art may modify or learn from the embodiments for various applications, such as microcontroller, digital signal processor and other types of chips. In microcontroller or digital signal processor, the control circuit 32 in the above embodiments is CPU, in telephone IC, the control circuit 32 is logic circuit of the state machine (different from the state machine of the flash memory), and in other chips, the control circuit 32 may be the logic circuit to control the chip operation and process.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A method for on-system programming a chip including a control circuit connected to an off-system programmable nonvolatile memory and a on-system programmable nonvolatile memory, a pumping circuit connected to said on-system programmable nonvolatile memory for providing an internal programming voltage thereto, and a volatile memory and an I/O unit both connected to said control circuit, said on-system programmable nonvolatile memory having a flash memory array, said method comprising the steps of:

reading out a program code from said off-system programmable nonvolatile for operating said control circuit;

reading out a content from said on-system programmable nonvolatile and storing it to said volatile memory;

amending a portion of said content for obtaining an amended content; and programming said amended content to said on-system programmable nonvolatile memory.

2. The method of claim 1, further comprising operating a state machine for preventing said on-system programmable nonvolatile memory from over erasing.

3. The method of claim 1, further comprising executing a state machine program for preventing said on-system programmable nonvolatile memory from over erasing.

4. The method of claim 1, further comprising reading out a programming process from said off-system programmable nonvolatile memory for an operation of programming said on-system programmable nonvolatile memory.

5. The method of claim 1, further comprising switching said chip to an operation mode.

6. A method for on-system programming a chip including a control circuit connected to off-system programmable nonvolatile memory and an on-system programmable nonvolatile memory, a pumping circuit connected to said on-system programmable nonvolatile memory for providing an internal programming voltage thereto, and a volatile memory and an I/O unit both connected to said control circuit, said on-system programmable nonvolatile memory having an electrical erasable memory array, said method comprising the steps of:

reading out a program code from said off-system programmable nonvolatile for operating said control circuit;

reading in a desired amendment content from said I/O unit; and programming said desired amendment content to said on-system programmable nonvolatile memory.

7. The method of claim 6, further comprising reading out a programming process from said off-system programmable nonvolatile memory for an operation of programming said on-system programmable nonvolatile memory.

8. The method of claim 6, further comprising switching said chip to an operation mode.

* * * * *